US012693158B2

(12) United States Patent
Huang et al.

(10) Patent No.: US 12,693,158 B2
(45) Date of Patent: Jul. 28, 2026

(54) OPTICAL SIGNAL RECEIVING CIRCUIT USED IN AN OPTICAL SENSING APPARATUS

(71) Applicant: Artilux, Inc., Menlo Park, CA (US)

(72) Inventors: Shih-Jou Huang, Hsinchu County (TW); Che-Fu Liang, Hsinchu County (TW); Chien-Lung Chen, Hsinchu County (TW)

(73) Assignee: Artilux, Inc., Menlo Park, CA (US)

( * ) Notice: Subject to any disclaimer, the term of this patent is extended or adjusted under 35 U.S.C. 154(b) by 106 days.

(21) Appl. No.: 18/917,693

(22) Filed: Oct. 16, 2024

(65) Prior Publication Data

US 2025/0155284 A1 May 15, 2025

Related U.S. Application Data

(60) Provisional application No. 63/598,546, filed on Nov. 14, 2023.

(51) Int. Cl.
G01J 1/44 (2006.01)
H03F 3/45 (2006.01)

(52) U.S. Cl.
CPC ............ G01J 1/44 (2013.01); H03F 3/45475 (2013.01)

(58) Field of Classification Search
CPC ........ G01J 1/44; H03F 3/45475; H03F 3/082; H03F 3/087; G01D 5/26
See application file for complete search history.

(56) References Cited

U.S. PATENT DOCUMENTS

| | | |
|---|---|---|
| 11,703,590 B2 | 7/2023 | Liu et al. |
| 11,750,956 B2 | 9/2023 | Fu et al. |
| 2011/0026921 A1* | 2/2011 | Ossieur ................ H04B 10/272 |
| | | 398/58 |
| 2019/0349655 A1* | 11/2019 | Fu ...................... H04Q 11/0067 |
| 2022/0329222 A1 | 10/2022 | Lakshmikumar et al. |
| 2023/0066864 A1 | 3/2023 | Zhang et al. |

* cited by examiner

*Primary Examiner* — Seung C Sohn
(74) *Attorney, Agent, or Firm* — Dority & Manning, P.A.

(57) ABSTRACT

An optical sensing apparatus includes an optical signal receiving circuit configured to receive a photocurrent signal from an optoelectronic detector and generate a differential voltage signal. The optical signal receiving circuit includes a transimpedance amplifier coupled to the optoelectronic detector and configured to convert the photocurrent signal from the optoelectronic detector into a first voltage signal. The optical signal receiving circuit includes a first power source configured to provide a first bias voltage for the optoelectronic detector. The optical signal receiving circuit includes an adjustment circuit coupled to the transimpedance amplifier and configured to adjust the first voltage signal to generate a second voltage signal. The optical signal receiving circuit includes a single-ended-to-differential converter coupled to the adjustment circuit and configured to convert the second voltage signal into the differential voltage signal.

20 Claims, 5 Drawing Sheets

500

600

OPTICAL SIGNAL RECEIVING CIRCUIT USED IN AN OPTICAL SENSING APPARATUS

RELATED APPLICATIONS

The subject application claims the benefit of priority to U.S.

Provisional Patent Application No. 63/598,546 filed on Nov. 14, 2023, entitled "Optical Signal Receiving Circuit used in an Optical Sensing Apparatus," which is incorporated by reference herein in its entirety for all purposes.

FIELD

The present disclosure relates generally to technology for use with optical sensing apparatuses (e.g., optical sensing apparatuses including optical signal receiving circuits) and related applications.

BACKGROUND

The optical sensing apparatuses are being used in many devices, such as smartphones, wearable electronics, robotics, and autonomous vehicles, etc. for proximity detection, 2D/3D imaging, object recognition, image enhancement, material recognition, color fusion, health monitoring, and other relevant applications.

The present disclosure relates to an optical sensing apparatus, and in particular to an optical sensing apparatus having an optical signal receiving circuit, which is configured to convert a photocurrent into a differential voltage signal.

SUMMARY

Aspects and advantages of embodiments of the present disclosure will be set forth in part in the following description, or may be learned from the description, or may be learned through practice of the embodiments.

One example aspect of the present disclosure is directed to an optical sensing apparatus that includes an optical signal receiving circuit configured to receive a photocurrent signal from an optoelectronic detector and generate a differential voltage signal. The optical signal receiving circuit includes a transimpedance amplifier coupled to the optoelectronic detector and configured to convert the photocurrent signal from the optoelectronic detector into a first voltage signal. The optical signal receiving circuit includes a first power source configured to provide a first bias voltage for the optoelectronic detector. The optical signal receiving circuit includes an adjustment circuit coupled to the transimpedance amplifier and configured to adjust the first voltage signal to generate a second voltage signal. The optical signal receiving circuit includes a single-ended-to-differential converter coupled to the adjustment circuit and configured to convert the second voltage signal into the differential voltage signal.

In some implementations, the first power source is coupled to an input of the transimpedance amplifier.

In some implementations, the first voltage signal is higher than the second voltage signal.

In some implementations, the optical signal receiving circuit includes a second power source configured to provide a second bias voltage for the single-ended-to-differential converter, and wherein the second bias voltage is greater than the first bias voltage.

In some implementations, the adjustment circuit includes a first level shifter coupled to a first input of the single-ended-to-differential converter and configured to provide a first voltage level shift to the first voltage signal.

In some implementations, the adjustment circuit includes a second level shifter located between a second input of the single-ended-to-differential converter and the second power source, and the second level shifter is configured to provide a first voltage level shift to the second bias voltage.

In some implementations, the adjustment circuit includes a first switch coupled to the transimpedance amplifier and configured to switch to the first level shifter or switch to the first input of the single-ended-to-differential converter according to the first bias voltage.

In some implementations, the adjustment circuit includes a second switch and a second level shifter which are located between a second input of the single-ended-to-differential converter and the second power source, and the second switch is configured to switch to the second level shifter or switch to the second input of the single-ended-to-differential converter according to the first bias voltage.

In some implementations, the transimpedance amplifier includes an amplifier including a first input and a second input, and the first input connects to the optoelectronic detector.

In some implementations, the second input connects to the first power source.

In some implementations, the transimpedance amplifier includes a first feedback resistor located between and connecting to the first input of the amplifier and an output of the amplifier.

In some implementations, the single-ended-to-differential converter includes a third level shifter is coupled to an output terminal of the single-ended-to-differential converter and configured to provide a second voltage level shift to the second voltage signal.

In some implementations, the single-ended-to-differential converter includes an inverting amplifier configured to receive the second voltage signal.

In some implementations, the single-ended-to-differential converter includes a fourth level shifter is coupled to an output of the inverting amplifier and configured to provide a second voltage level shift.

Another example aspect of the present disclosure is directed to an optical sensing apparatus configured to receive an optical signal. The optical sensing apparatus includes an optoelectronic detector configured to generate a photocurrent signal in response to the optical signal. The optical sensing apparatus includes an optical signal receiving circuit configured to receive the photocurrent signal and generate a differential voltage signal. The optical signal receiving circuit includes a transimpedance amplifier coupled to the optoelectronic detector and configured to convert the photocurrent signal from the optoelectronic detector into a first voltage signal. The optical signal receiving circuit includes a first power source configured to provide a first bias voltage to the optoelectronic detector. The optical signal receiving circuit includes a single-ended-to-differential converter coupled to the transimpedance amplifier and configured to convert the first voltage signal into the differential voltage signal. The single-ended-to-differential converter includes a level shifter configured to provide a voltage level shift according to the first bias voltage.

In some implementations, the level shifter receives the first voltage signal and provides the voltage level shift to the first voltage signal to generate a positive voltage signal of the differential voltage signal.

In some implementations, the optical signal receiving circuit includes a second power source configured to provide a second bias voltage for the single-ended-to-differential converter, and the second bias voltage is greater than the first bias voltage.

In some implementations, the single-ended-to-differential converter includes an inverting amplifier configured to receive the first voltage signal for a negative voltage signal of the differential voltage signal.

In some implementations, the level shifter is coupled to an output of the inverting amplifier and provides the voltage level shift to generate the negative voltage signal of the differential voltage signal.

In some implementations, the first power source is coupled to the transimpedance amplifier.

Other example aspects of the present disclosure are directed to systems, methods, apparatuses, sensors, computing devices, tangible non-transitory computer-readable media, and memory devices related to the described technology.

These and other features, aspects and advantages of various embodiments will become better understood with reference to the following description and appended claims. The accompanying drawings, which are incorporated in and constitute a part of this specification, illustrate embodiments of the present disclosure, and together with the description, serve to explain the related principles.

BRIEF DESCRIPTION OF THE DRAWINGS

The foregoing aspects and many of the advantages of this application will become more readily appreciated as the same becomes better understood by reference to the following detailed description, when taken in conjunction with the accompanying drawings.

DETAILED DESCRIPTION

Figure 1:
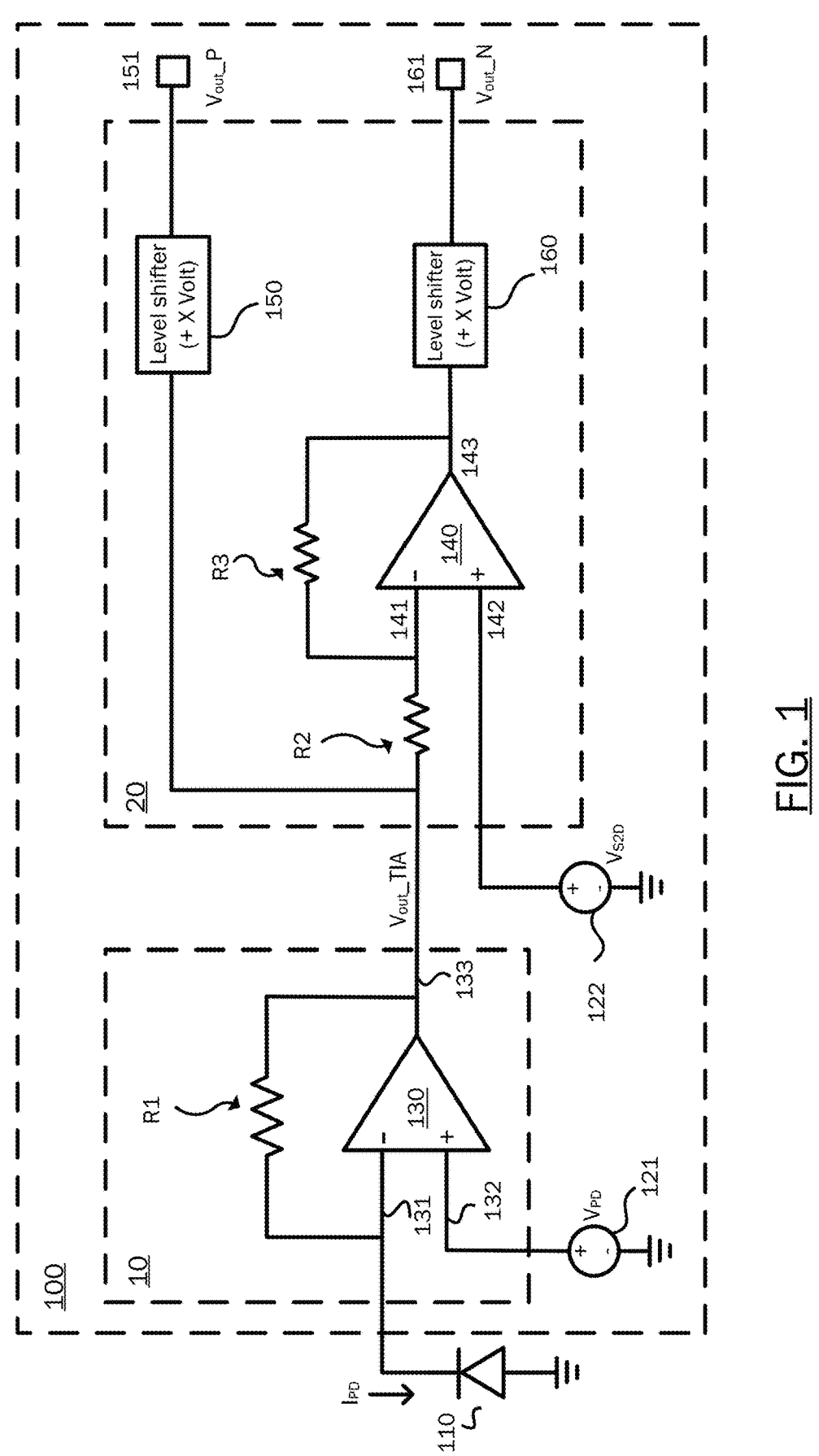
FIG. 1 illustrates a schematic structure diagram of an optical signal receiving circuit in accordance with one embodiment of the present disclosure.

The following embodiments accompany the drawings to illustrate the concept of the present disclosure. In the drawings or descriptions, similar or identical parts use the same reference numerals, and in the drawings, the shape, thickness, or height of the element can be reasonably expanded or reduced. The embodiments listed in the present application are only used to illustrate the present application and are not used to limit the scope of the present application. Any obvious modification or change made to the present application does not depart from the spirit and scope of the present application.

The present disclosure discloses an optical sensing apparatus having an optical signal receiving circuit, which is configured to convert a photocurrent signal in response to a sensed optical signal into differential voltage signals and transmit the differential voltage signals to an analog-to-digital converter (ADC) for digital signal processing. The differential voltage signal should have a DC voltage that matches the ADC input to avoid signal distortion. Therefore, the optical signal receiving circuit not only needs to generate differential voltage signals to the ADC but the DC voltage of the differential voltage signal should be maintained within a matching range that matches the ADC inputs.

FIG. 1 illustrates a schematic structure diagram of an optical signal receiving circuit 100 in accordance with one embodiment of the present disclosure. An optoelectronic detector 110, such as a photodiode, is configured to receive an optical signal and generate a corresponding photocurrent signal $I_{PD}$. The optoelectronic detector 110 can include a supporting substrate and a detecting region supported by the supporting substrate. The detecting region can include the IV group, such as germanium (Ge) or silicon, or a material compound in the III-V group (e.g., GaAs), and is configured to absorb photons. The supporting substrate can include a material, such as silicon. The optical signal receiving circuit 100 is coupled to the optoelectronic detector 110 and is configured to receive the photocurrent signal $I_{PD}$ from the optoelectronic detector 110 in response to a sensed optical signal and generate a differential voltage signal $V_{out\_}$P, $V_{out\_}$N at the output terminals 151, 161 to an ADC (not shown) for further processing. In general, it is desirable to match the DC voltages of the differential voltage signals $V_{out\_}$P, $V_{out\_}$N to the ADC inputs to avoid signal distortion.

The optical signal receiving circuit 100 includes a transimpedance amplifier (TIA) 10 and a single-ended-to-differential (S2D) converter 20 and is coupled to the ADC through the output terminals 151, 161. The TIA 10 is electrically coupled to the optoelectronic detector 110 and is configured to convert the photocurrent signal $I_{PD}$ from the optoelectronic detector 110 into a voltage signal $V_{out\_}$TIA. The TIA 10 includes an amplifier 130 which has a first input 131 (e.g., a negative input), a second input 132 (e.g., a positive input), and an output 133. The output 133 can be regarded as an output of the TIA 10 and output the voltage signal $V_{out\_}$TIA. In some implementations, the first input 131 of amplifier 130 is coupled to the cathode of the optoelectronic detector 110 to receive the photocurrent signal $I_{PD}$ generated by the optoelectronic detector 110. The anode of the optoelectronic detector 110 may be coupled to a reference voltage (e.g., the ground). A TIA power source 121 is coupled to the second input 132 of the amplifier 130 and provides a bias voltage $V_{PD}$ to the optoelectronic detector 110. A feedback resistor R1 is coupled to the first input 131 and the output 133 of the amplifier 130. The amplifier 130 is configured to provide a transimpedance gain on the photocurrent signal $I_{PD}$ to generate the voltage signal $V_{out\_}$TIA at the output 133.

The S2D converter 20 is coupled to the TIA 10 and is configured to convert the voltage signal $V_{out\_}$TIA from the TIA 10 into differential voltage signal $V_{out\_}$P, $V_{out\_}$N for the ADC (not shown) through the positive output terminal 151 and the negative output terminal 161. The S2D converter 20 includes an inverting amplifier 140, a first level shifter 150, and a second level shifter 160. The positive output terminal 151 is coupled to the output 133 of the TIA 10 through the first level shifter 150, which provides a positive voltage signal $V_{out}$_P at the positive output terminal 151 to the ADC. The inverting amplifier 140 is configured to provide a negative voltage signal at the negative output terminal 161 to the ADC. In some implementations, the inverting amplifier 140 includes a first input 141 (e.g., negative input) coupled to the output 133 of the TIA 10 through a resistor R2, a second input 142 (e.g., positive input) coupled to a S2D power source 122 which provides a bias voltage $V_{S2D}$ to the inverting amplifier 140, and an output 143 coupled to the negative output terminal 161 for providing a negative voltage signal $V_{out}$_N to the ADC. A feedback resistor R3 is coupled to the first input 141 and the output 143 of the inverting amplifier 140.

To provide the differential voltage signals $V_{out}$_P, $V_{out}$_N with matching DC voltage to the ADC, the first level shifter 150 is coupled to the output 133 of the TIA 10 to receive the voltage signal $V_{out}$_TIA and provides a DC voltage level shift, such as +X volt, to the voltage signal $V_{out}$_TIA to generate the positive voltage signal $V_{out}$_P. For example, X can be 0.5V or any suitable voltage. The second level shifter 160 is coupled to the output 143 of the inverting amplifier 140 and the negative output terminal 161 to provide a DC voltage level shift, such as +X volt, to the voltage signal at the output 143 to generate the negative voltage signal $V_{out}$_N.

The S2D power source 122 is coupled to the second input 142 of the inverting amplifier 140 to provide the bias voltage $V_{S2D}$, which can be larger than the bias voltage $V_{PD}$, to the S2D converter 20, and the difference d between the bias voltage $V_{S2D}$ and $V_{PD}$ can be determined by the DC voltage of ADC input. For example, $$V_{S2D} = V_{PD} + d, d = 0.3 \text{ V}, V_{PD} = 0.1{\sim}0.3 \text{ V}$$

Therefore, the voltage of the differential voltage signals $V_{out}$_P, $V_{out}$_N can be expressed by the following equations:

$$V_{out}\_\text{TIA} = V_{PD} + (I_{PD} \times R1)$$

$$V_{out}\_\text{P} = V_{PD} + (I_{PD} \times R1) + X$$

$$V_{out}\_\text{N} = \left( \frac{V_{S2D} - V_{out}\_\text{TIA}}{R2} \times R3 + V_{S2D} \right) + X$$

$$\text{when } R2 = R3, V_{S2D} = V_{PD} + d$$

$$V_{out}\_\text{N} = 2 \times V_{S2D} - V_{out}\_\text{TIA} + X = 2d + V_{PD} - (I_{PD} \times R1) + X$$

The DC voltages of the differential voltage signals $V_{out}$_P and $V_{out}$_N are $V_{PD}$+X and 2d+$V_{PD}$+X respectively and can be matched to the ADC inputs.

In an implementation, the bias voltage $V_{PD}$ could be set in the range of about 0.1V~0.3V for the optoelectronic detector 110, and the optoelectronic detector 110 could generate a large enough photocurrent signal $I_{PD}$ for the optical signal receiving circuit 100. Since the bias voltage $V_{PD}$ could be set in the range of 0.1V~0.3V, it may slightly vary by up to 0.2V. Therefore, the DC voltages of the differential voltage signals $V_{out}$_P and $V_{out}$_N may also have a variation up to 0.2V. However, even with this variation, the DC voltages of the differential voltage signals $V_{out}$_P and $V_{out}$_N can still remain within the matching range and match the ADC inputs.

In some cases, the optoelectronic detector 110 may need a higher bias voltage $V'_{PD}=V_{PD}+\Delta V$, such as $V'_{PD}$=0.6~0.8V, to generate large enough photocurrent signal $I_{PD}$ for optical signal receiving circuit processing. For example, an operation of a germanium-based photodiode may require a higher bias voltage than an operation of a III-V compound material-based photodiode. However, by simply replacing the optoelectronic detector 110 from a III-V compound material-based photodiode to a germanium-based photodiode, the higher bias voltage $V'_{PD}$ may cause the DC voltage of the differential voltage signals $V_{out}$_P, $V_{out}$_N to exceed the matching range and not match the ADC inputs. Accordingly, it is desirable to have a circuit that can manage optoelectronic detectors having different operation bias voltages.

Figure 2:
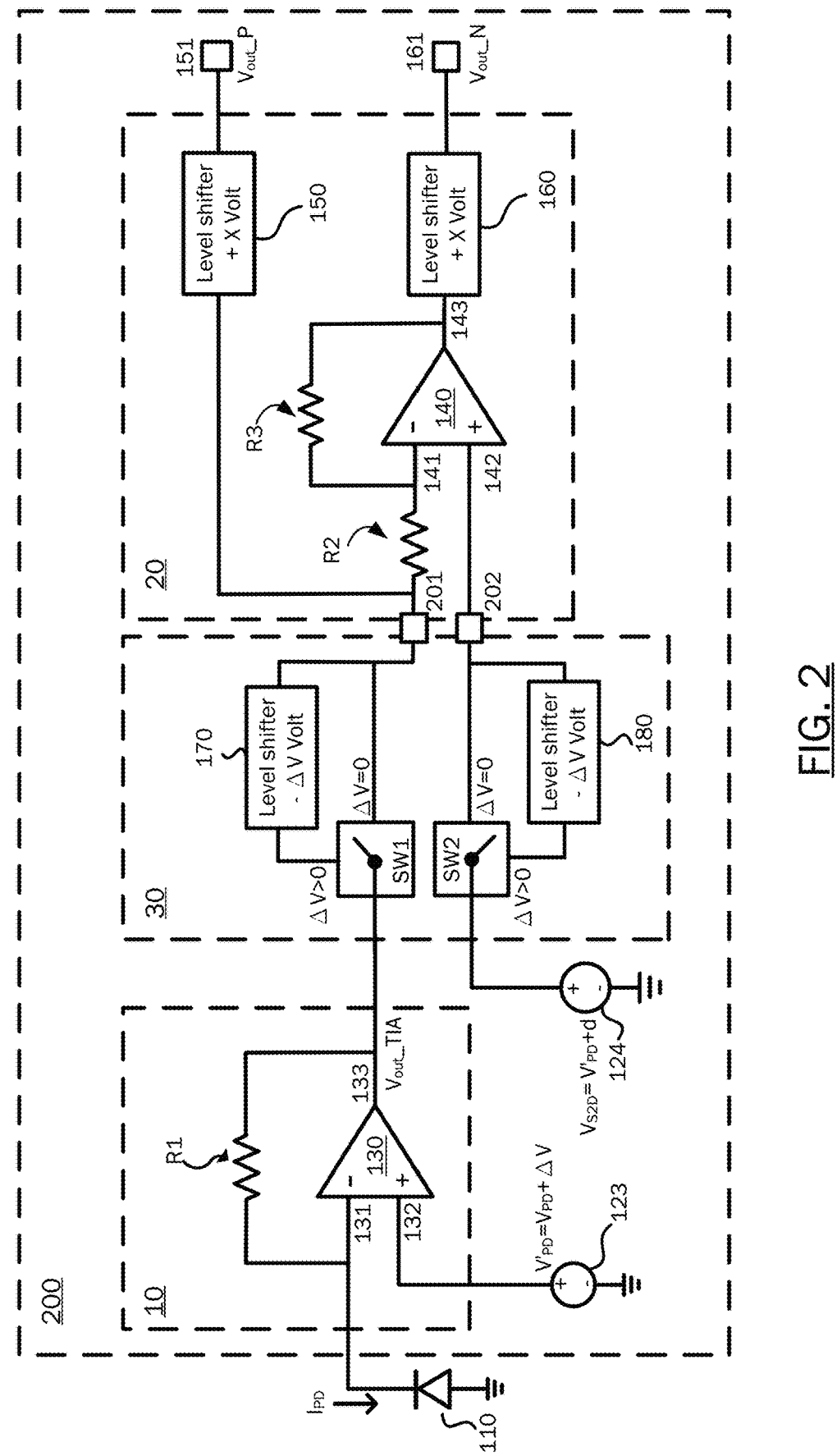
FIG. 2 illustrates a schematic structure diagram of an optical signal receiving circuit in accordance with another embodiment of the present disclosure.

FIG. 2 illustrates a schematic structure diagram of an optical signal receiving circuit 200 in accordance with another embodiment of the present disclosure. The optical signal receiving circuit 200 can provide a multi-stage bias voltage $V'_{PD}=V_{PD}+\Delta V$, where $\Delta V \geq 0$, for a different optoelectronic detector 110 and generate the differential voltage signals $V_{out}$_P, $V_{out}$_N. Regardless of the change in $\Delta V$, the DC voltages of the differential voltage signals $V_{out}$_P, $V_{out}$_N can be maintained within the matching range to match the ADC inputs. The optical signal receiving circuit 200 includes a TIA 10, a S2D converter 20, and an adjustment circuit 30 located between the TIA 10 and the S2D converter 20. The TIA 10 of FIG. 2 is similar to the TIA 10 shown in FIG. 1 and includes an amplifier 130 which has a first input 131, a second input 132, and an output 133. The first input 131 of amplifier 130 is coupled to the cathode of the optoelectronic detector 110 to receive the photocurrent signal $I_{PD}$ generated by the optoelectronic detector 110. A feedback resistor R1 is coupled between the first input 131 and the output 133 of the amplifier 130. The amplifier 130 is configured to provide a transimpedance gain on the photocurrent signal $I_{PD}$ to generate the voltage signal $V_{out}$_TIA at the output 133. A TIA power source 123 is coupled to the second input 132 of the amplifier 130 and can provide a multi-stage bias voltage $V'_{PD}=V_{PD}+\Delta V$ to the optoelectronic detector 110. In an implementation, $V_{PD}$=0.1~0.3V and $\Delta V$=0~0.7V. In another implementation, $V_{PD}$=0.1~0.3V and $\Delta V$=0.3~0.5V.

The S2D converter 20 of FIG. 2 is similar to the S2D converter 20 shown in FIG. 1 and is coupled to the ADC (not shown) through the output terminals 151, 161. The S2D converter 20 includes a first input 201 and a second input 202 connecting to the adjustment circuit 30 and is configured to generate differential voltage signals $V_{out}$_P, $V_{out}$_N, which are sent to the ADC (not shown) through the positive output terminal 151 and the negative output terminal 161. The S2D converter 20 includes an inverting amplifier 140 to provide a negative voltage signal. The inverting amplifier 140 has a first input 141 and a second input 142 coupled to the adjustment circuit 30. A feedback resistor R3 is coupled between the first input 141 and the output 143 of the inverting amplifier 140. A resistor R2 is coupled between the first input 141 of the inverting amplifier 140 and the first input 201 of the S2D converter 20.

In order to ensure that the DC voltages at the output terminals 151, 161 of S2D converter 20 are not affected by changes in the bias voltage $V'_{PD}$ provided by the TIA power source 123 and can be maintained within the matching range of the ADC inputs, the adjustment circuit 30 is provided between the TIA 10 and the S2D converter 20. The adjustment circuit 30 is coupled to the TIA 10 to receive the voltage signal $V_{out}$_TIA and is configured to adjust the DC voltage of the voltage signal $V_{out}$_TIA from the TIA 10 to ensure that S2D converter 20 can output differential signals with DC voltages that can be maintained within the matching range of the ADC inputs. There is a difference d between the bias voltage $V_{S2D}$ provided by the S2D power source 124 and the bias voltage $V'_{PD}$ provided by the TIA power source 123, so the bias voltage $V_{S2D}$ will also be affected by changes in the bias voltage $V'_{PD}$. Therefore, the bias voltage $V_{S2D}$ provided by the S2D power source 124 also needs to be adjusted to ensure that the S2D converter 20 can output differential signals with DC voltages that can be maintained within the matching range of the ADC inputs. Therefore, the adjustment circuit 30 is coupled to the S2D power source 124 to adjust the bias voltage $V_{S2D}$ provided by the S2D power source 124. The S2D power source 124 of FIG. 2 is similar to the S2D power source 122 shown in FIG. 1 and provides the bias voltage $V_{S2D}$ to S2D converter 20. The bias voltage $V_{S2D}$ provided by the S2D power source 124 is greater than that provided by the TIA power source 123 by d. In other words, $$V_{S2D} = V'_{PD} + d = (V_{PD} + \Delta V) + d$$

The adjustment circuit 30 includes a first switch SW1 and a first level shifter 170 connecting between the output 133 of the TIA 10 and the first input 201 of the S2D converter 20 to adjust the change of voltage signal $V_{out}$_TIA due to the variation of the bias voltage $V'_{PD}$ from the TIA power source 123. The adjustment circuit 30 also includes a second switch SW2 and a second level shifter 180 located between and connecting to the S2D power source 124 and the second input 202 of the S2D converter 20 to adjust the change of bias voltage $V_{S2D}$ due to the variation of the bias voltage $V'_{PD}$ from the TIA power source 123. The first level shifter 170 and the second level shifter 180 can provide a negative $\Delta V$ voltage level shift to the voltage signal $V_{out}$_TIA and the bias voltage $V_{S2D}$ respectively. The connection mode of the first switch SW1 and the second switch SW2 can be controlled by a different setting (e.g., register setting) based on the bias voltage $V'_{PD}$ from the TIA power source 123.

As an example, when $\Delta V$ of the bias voltage $V'_{PD} = V_{PD} + \Delta V$ is larger than zero ($\Delta V > 0$), the first switch SW1 is configured to switch to connect to the first level shifter 170 and the SW2 is configured to switch to connect to the second level shifter 180. Therefore, the first level shifter 170 provides a negative $\Delta V$ voltage level shift to the voltage signal $V_{out}$_TIA for transmitting to the first input 201 of S2D converter 20, and the second level shifter 180 provides a negative $\Delta V$ voltage level shift to the bias voltage $V_{S2D}$ to the second input 202 of S2D converter 20.

Hence, the voltage at the inputs 201, 202 of the S2D converter 20 can be expressed by the following equations:

$$V_{201} = (V_{PD} + \Delta V) + (I_{PD} \times R1) - \Delta V = V_{PD} + I_{PD} \times R1$$

$$V_{202} = V_{S2D} - \Delta V = (V_{PD} + \Delta V + d) - \Delta V = V_{PD} + d$$

Then, the voltage of the differential voltage signals $V_{out}$_P, $V_{out}$_N can be expressed by the following equations:

$$V_{out}\_P = V_{201} + X = (V_{PD} + I_{PD} \times R1) + X$$

-continued $$V_{out}\_N = \left(\frac{V_{202} - V_{201}}{R2} \times R3 + V_{202}\right) + X$$

when $R2 = R3$ $$V_{out}\_N = 2 \times V_{202} - V_{201} + X = 2d + V_{PD} - I_{PD} \times R1 + X$$

The DC voltages of the differential voltage signals $V_{out}$_P, $V_{out}$_N can be maintained within the matching range, which are $V_{PD} + X$ and $2d + V_{PD} + X$, same as the optical signal receiving circuit 100 shown in FIG. 1. In other words, when the TIA power source 123 provides a high stage bias voltage $V_{PD} + \Delta V$, where $\Delta V$ is greater than zero, the first switch SW1 and the second switch SW2 can be switched to the level shifters 170, 180 to adjust the variation of the voltage signals, and then the outputs of the optical signal receiving circuit 200 can provide differential voltage signals with DC voltages that can be maintained within the matching range of the ADC inputs.

When $\Delta V$ of the bias voltage $V_{PD} + \Delta V$ is zero, then the bias voltage $V_{S2D}$ is $V_{PD} + d$, the first switch SW1 is configured to switch to connect to the first input 201 and directly outputs $V_{out}$_TIA from the TIA 10 to the S2D converter 20, and the second switch SW2 is configured to switch to connect to the second input 202 and directly outputs $V_{S2D}$ from the S2D power source 124 to the S2D converter 20. In other words, when the TIA power source 123 provides a low stage bias voltage $V_{PD}$, the first switch SW1 and the second switch SW2 can be switched to bypass the level shifters 170, 180, and the optical signal receiving circuit 200 operates in the same configuration as the optical signal receiving circuit 100 shown in FIG. 1.

Figure 3:
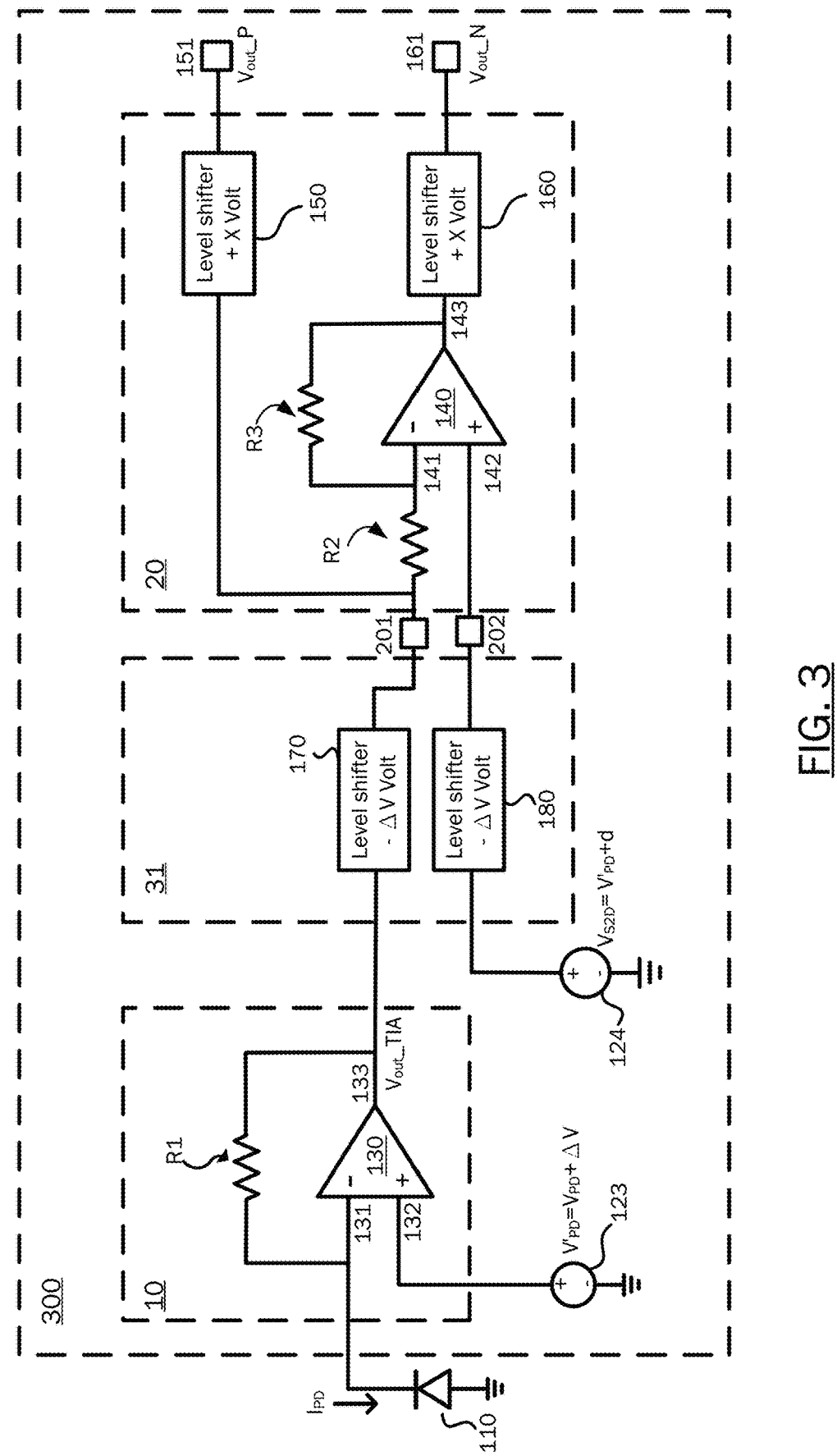
FIG. 3 illustrates a schematic structure diagram of an optical signal receiving circuit in accordance with another embodiment of the present disclosure.

FIG. 3 illustrates a schematic structure diagram of an optical signal receiving circuit 300 in accordance with another embodiment of the present disclosure. The optical signal receiving circuit 300 is similar to the optical signal receiving circuit 200 and can provide a multi-stage bias voltage $V'_{PD} = V_{PD} + \Delta V$, $\Delta V \geq 0$, for a different optoelectronic detector 110 and generate the differential voltage signals $V_{out}$_P, $V_{out}$_N. Regardless of the change in $\Delta V$, the DC voltages of the differential voltage signals $V_{out}$_P, $V_{out}$_N can be maintained within the matching range to match the ADC inputs. The optical signal receiving circuit 300 includes a TIA 10, a S2D converter 20, and an adjustment circuit 31 located between the TIA 10 and the S2D converter 20. The TIA 10 and The S2D converter 20 are the same as the aforementioned description. A TIA power source 123 is coupled to the second input 132 of the amplifier 130 and can provide multi-stage bias voltage $V'_{PD} = V_{PD} + \Delta V$ to the optoelectronic detector 110. For example, $V_{PD} = 0.1 \sim 0.3V$ and $\Delta V = 0 \sim 0.7V$.

The adjustment circuit 31 is coupled to the TIA 10 to receive the voltage signal $V_{out}$_TIA and is configured to adjust the DC voltage of the voltage signal $V_{out}$_TIA from the TIA 10 to ensure that S2D converter 20 can output differential voltage signals with DC voltages that can be maintained within the matching range of the ADC inputs. The adjustment circuit 31 also is coupled to the S2D power source 124 to adjust the bias voltage $V_{S2D}$ provided by the S2D power source 124 to ensure that S2D converter 20 can output differential voltage signals with DC voltages that can be maintained within the matching range of the ADC inputs. The adjustment circuit 31 includes a first level shifter 170 located between and connecting to the output 133 of the TIA 10 and the first input 201 of the S2D converter 20 to adjust the change of voltage signal $V_{out}$_TIA due to the variation of the bias voltage V'$_{PD}$ from the TIA power source 123. The adjustment circuit 31 also includes a second level shifter 180 located between and connecting to the S2D power source 124 and the second input 202 of the S2D converter 20 to adjust the bias voltage V$_{S2D}$ due to the variation of the bias voltage V'$_{PD}$ from the TIA power source 123. When the TIA power source 123 provides multi-stage bias voltage V'$_{PD}$=V$_{PD}$+ΔV to the optoelectronic detector 110, the first level shifter 170 and the second level shifter 180 can provide a negative ΔV voltage level shift to the voltage signal V$_{out}$_TIA and the bias voltage V$_{S2D}$ respectively, where ΔV is equal to zero or greater than zero.

Figure 4:
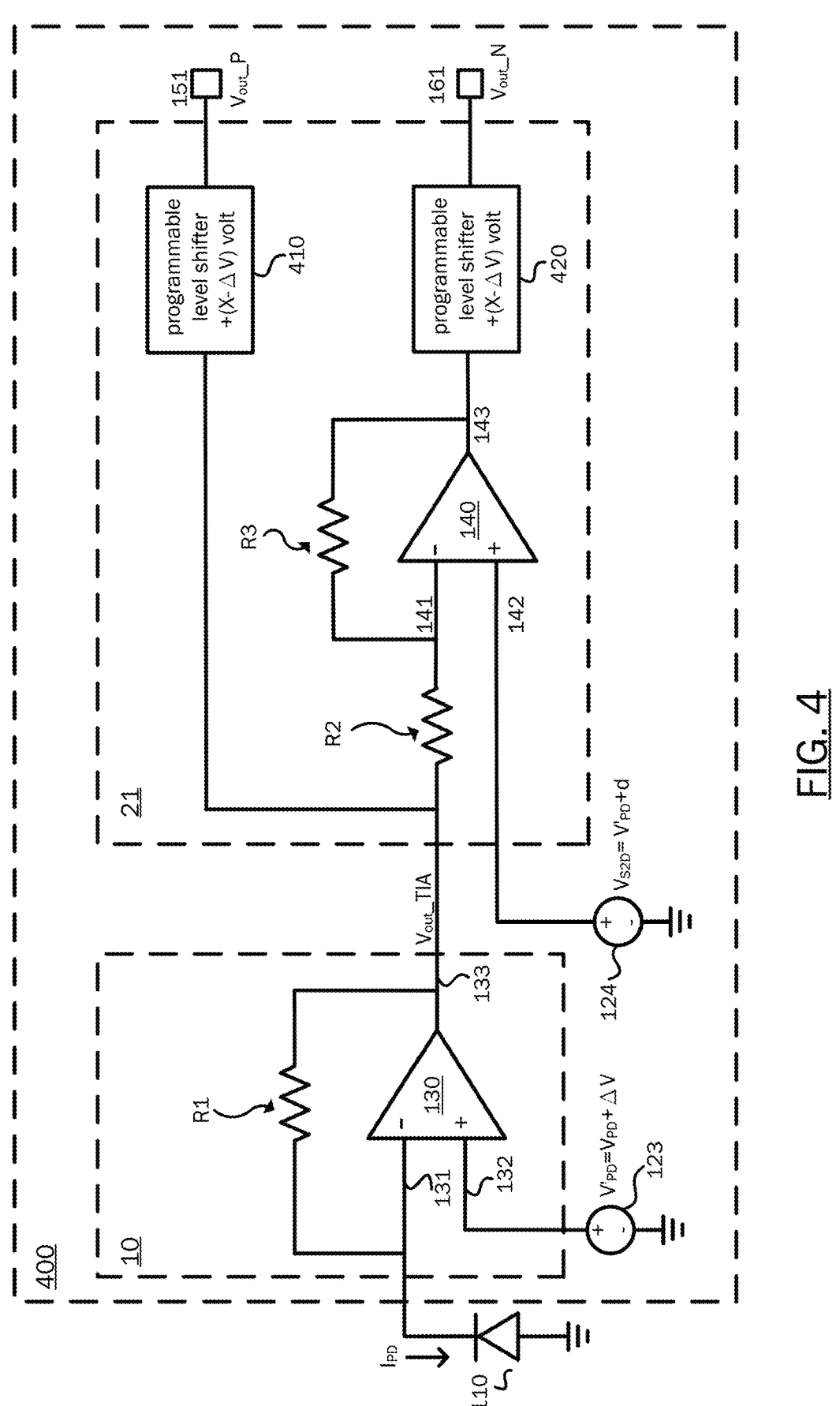
FIG. 4 illustrates a schematic structure diagram of an optical signal receiving circuit in accordance with another embodiment of the present disclosure.

FIG. 4 illustrates a schematic structure diagram of an optical signal receiving circuit 400 in accordance with another embodiment of the present disclosure. The optical signal receiving circuit 400 can provide a multi-stage bias voltage V'$_{PD}$=V$_{PD}$+ΔV for different optoelectronic detector 110 and generate the differential voltage signals V$_{out}$_P, V$_{out}$_N. Regardless of the change in ΔV, the DC voltages of the differential voltage signals V$_{out}$_P, V$_{out}$_N can be maintained within the matching range to match the ADC inputs. The optical signal receiving circuit 400 includes a TIA 10 and a S2D converter 21. The TIA 10 is the same as the aforementioned description. A TIA power source 123 is coupled to the second input 132 of the amplifier 130 and can provide multi-stage bias voltage V'$_{PD}$=V$_{PD}$+ΔV to the optoelectronic detector 110. The S2D converter 21 is coupled to the TIA 10 for converting the voltage signal V$_{out}$_TIA from the TIA 10 into differential voltage signals V$_{out}$_P, V$_{out}$_N, and sending to the ADC (not shown) through the positive output terminal 151 and the negative output terminal 161. The S2D converter 21 includes an inverting amplifier 140, a positive programmable level shifter 410, and a negative programmable level shifter 420. The positive programmable level shifter 410 and the negative programmable level shifter 420 could provide a changeable DC voltage level shift, that is plus (X-ΔV) volt, to the voltage signal V$_{out}$_TIA and the voltage of the output 143 of the inverting amplifier 140. Hence, the changeable DC voltage level shift can be determined according to the variation ΔV of the bias voltage V'$_{PD}$=V$_{PD}$+ΔV provided by the TIA power source 123.

Therefore, the voltage of the differential voltage signals V$_{out}$_P, V$_{out}$_N can be expressed by the following equations:

$$V_{out\_}TIA = (V_{PD} + \Delta V) + I_{PD} \times R1$$

$$V_{out\_}P = (V_{PD} + \Delta V) + I_{PD} \times R1 + (X - \Delta V) = V_{PD} + I_{PD} \times R1 + X$$

$$V_{out\_}N = \left( \frac{V_{S2D} - V_{out\_}TIA}{R2} \times R3 + V_{S2D} \right) + (X - \Delta V)$$

$$\text{when } R2 = R3, V_{S2D} = V_{PD} + \Delta V + d$$

$$V_{out\_}N = 2 \times V_{S2D} - V_{out\_}TIA + (X - \Delta V) = 2d + V_{PD} - I_{PD} \times R1 + X$$

The DC voltages of the differential voltage signals V$_{out}$_P and V$_{out}$_N are V$_{PD}$+X and 2d+V$_{PD}$+X respectively and can be maintained within the matching range of the ADC inputs.

Figure 5:
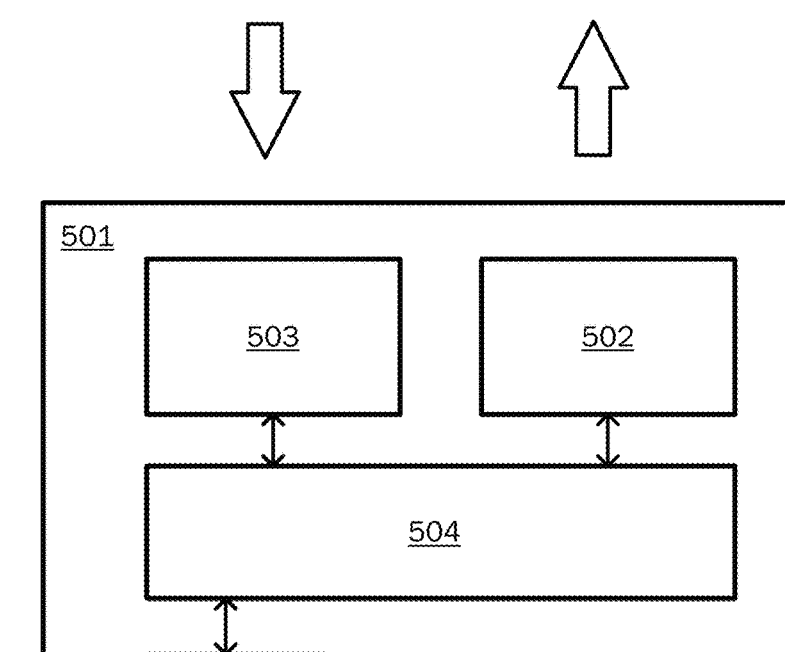
FIG. 5 illustrates a schematic diagram of an optical sensing apparatus in accordance with one embodiment of the present disclosure.

FIG. 5 illustrates a schematic diagram of an optical sensing apparatus in accordance with one embodiment of the present disclosure. The optical sensing apparatus 500 can include a light transmitter 502, a light receiver 503, a processor 504, and a memory 505 which are located in a housing 501. The light transmitter 502 includes a multi-band light emitter and is configured to emit at least two lights with different wavelengths. The light receiver 503 includes a multi-band or broadband optoelectronic detector and is configured to receive at least two lights at different wavelengths which correspond to the lights emitted from the light transmitter 502 for various detection, for example, proximity detection, 2D/3D imaging, object recognition, image enhancement, material recognition, color fusion, health monitoring, etc. The optoelectronic detector of light receiver 503 can be any of the aforementioned implementations. The processor 504 includes the aforementioned optical signal receiving circuit and is coupled to the light transmitter 502 and the light receiver 503. The processor 504 can be implemented by digital processor (DSP), general purpose processor, application-specific integrated circuit (ASIC), digital circuitry, software module, or any combinations thereof. The memory 505 is coupled to the processor 504.

Figure 6:
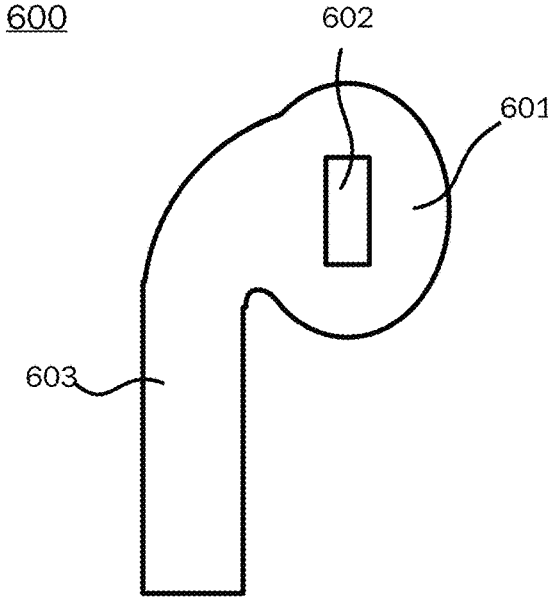
FIG. 6 illustrates a view of an electronic device in accordance with one embodiment of the present disclosure.

FIG. 6 illustrates a view of an electronic device 600 in accordance with one embodiment of the present disclosure. The electronic device 600 can be a wearable device or a portable device. The wearable device can be an earphone, a wristwatch, a head-mounted device, a ring, or other wearable electronic device. The portable device can be cellular telephone, tablet computer, laptop computer, computer mouse, computer stylus, or other accessories. The electronic device 600 shown in FIG. 6 is described herein as an example of an earphone. The electronic device 600 includes a main body 601 and an optical sensing apparatus 602 arranged in the main body 601. The main body 601 is configured for proximity to or in contact with an object, such as skin. Optionally, the electronic device 600 can include a protruding portion 603 connecting to the main body 601. In the example of the earphone, the main body 601 can be placed in the user's ear to play the audio.

Various means can be configured to perform the methods, operations, and processes described herein. For example, any of the systems and apparatuses (e.g., optical sensing devices and related circuitry) can include unit(s) and/or other means for performing their operations and functions described herein. In some implementations, one or more of the units may be implemented separately. In some implementations, one or more units may be a part of or included in one or more other units. These means can include processor(s), microprocessor(s), graphics processing unit(s), logic circuit(s), dedicated circuit(s), application-specific integrated circuit(s), programmable array logic, field-programmable gate array(s), controller(s), microcontroller(s), and/or other suitable hardware. The means can also, or alternately, include software control means implemented with a processor or logic circuitry, for example. The means can include or otherwise be able to access memory such as, for example, one or more non-transitory computer-readable storage media, such as random-access memory, read-only memory, electrically erasable programmable read-only memory, erasable programmable read-only memory, flash/other memory device(s), data register(s), database(s), and/or other suitable hardware.

As used herein, the terms such as "first", "second", "third", etc. describe various elements, components, regions, layers and/or sections, these elements, components, regions, layers and/or sections should not be limited by these terms. These terms may be only used to distinguish one element, component, region, layer, section, signal, or operation from another. The terms such as "first", "second", "third", etc. when used herein do not imply a sequence or order unless clearly indicated by the context. The terms "light-receiving", "light-detecting", "light-sensing" and any other similar terms can be used interchangeably.

Aspects of the disclosure have been described in terms of illustrative embodiments thereof. Numerous other embodiments, modifications, and/or variations within the scope and spirit of the appended claims can occur to persons of ordinary skill in the art from a review of this disclosure. Any and all features in the following claims can be combined and/or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein. Also, terms such as "based on" should be understood as "based at least in part on".

Those of ordinary skill in the art, using the disclosures provided herein, will understand that the elements of any of the claims discussed herein can be adapted, rearranged, expanded, omitted, combined, or modified in various ways without deviating from the scope of the present disclosure.

While the disclosure has been described by way of example and in terms of a preferred embodiment, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An optical sensing apparatus comprising:
an optical signal receiving circuit configured to receive a photocurrent signal from an optoelectronic detector and generate a differential voltage signal, and comprising:
a transimpedance amplifier coupled to the optoelectronic detector and configured to convert the photocurrent signal from the optoelectronic detector into a first voltage signal;
a first power source configured to provide a first bias voltage for the optoelectronic detector;
an adjustment circuit coupled to the transimpedance amplifier and configured to adjust the first voltage signal to generate a second voltage signal; and
a single-ended-to-differential converter coupled to the adjustment circuit and configured to convert the second voltage signal into the differential voltage signal.

2. The optical sensing apparatus of claim 1, wherein the first power source is coupled to an input of the transimpedance amplifier.

3. The optical sensing apparatus of claim 1, wherein the first voltage signal is higher than the second voltage signal.

4. The optical sensing apparatus of claim 1, wherein the optical signal receiving circuit comprises a second power source configured to provide a second bias voltage for the single-ended-to-differential converter, and wherein the second bias voltage is greater than the first bias voltage.

5. The optical sensing apparatus of claim 4, wherein the adjustment circuit comprises a first level shifter coupled to a first input of the single-ended-to-differential converter and configured to provide a first voltage level shift to the first voltage signal.

6. The optical sensing apparatus of claim 5, wherein the adjustment circuit comprises a second level shifter located between a second input of the single-ended-to-differential converter and the second power source, and the second level shifter is configured to provide a first voltage level shift to the second bias voltage.

7. The optical sensing apparatus of claim 5, wherein the adjustment circuit comprises a first switch coupled to the transimpedance amplifier and configured to switch to the first level shifter or switch to the first input of the single-ended-to-differential converter according to the first bias voltage.

8. The optical sensing apparatus of claim 7, wherein the adjustment circuit comprises a second switch and a second level shifter which are located between a second input of the single-ended-to-differential converter and the second power source, and the second switch is configured to switch to the second level shifter or switch to the second input of the single-ended-to-differential converter according to the first bias voltage.

9. The optical sensing apparatus of claim 1, wherein the transimpedance amplifier comprises an amplifier including a first input and a second input, and the first input connects to the optoelectronic detector.

10. The optical sensing apparatus of claim 9, wherein the second input connects to the first power source.

11. The optical sensing apparatus of claim 9, wherein the transimpedance amplifier comprises a first feedback resistor located between and connecting to the first input of the amplifier and an output of the amplifier.

12. The optical sensing apparatus of claim 1, wherein the single-ended-to-differential converter comprises a third level shifter is coupled to an output terminal of the single-ended-to-differential converter and configured to provide a second voltage level shift to the second voltage signal.

13. The optical sensing apparatus of claim 1, wherein the single-ended-to-differential converter comprises an inverting amplifier configured to receive the second voltage signal.

14. The optical sensing apparatus of claim 13, wherein the single-ended-to-differential converter comprises a fourth level shifter is coupled to an output of the inverting amplifier and configured to provide a second voltage level shift.

15. An optical sensing apparatus configured to receive an optical signal, comprising:
an optoelectronic detector configured to generate a photocurrent signal in response to the optical signal; and
an optical signal receiving circuit configured to receive the photocurrent signal and generate a differential voltage signal, and comprising:
a transimpedance amplifier coupled to the optoelectronic detector and configured to convert the photocurrent signal from the optoelectronic detector into a first voltage signal;
a first power source configured to provide a first bias voltage to the optoelectronic detector; and
a single-ended-to-differential converter coupled to the transimpedance amplifier and configured to convert the first voltage signal into the differential voltage signal,
wherein the single-ended-to-differential converter comprises a level shifter configured to provide a voltage level shift according to the first bias voltage.

16. The optical sensing apparatus of claim 15, wherein the level shifter receives the first voltage signal and provides the voltage level shift to the first voltage signal to generate a positive voltage signal of the differential voltage signal.

17. The optical sensing apparatus of claim 15, wherein the optical signal receiving circuit comprises a second power source configured to provide a second bias voltage for the single-ended-to-differential converter, and the second bias voltage is greater than the first bias voltage.

18. The optical sensing apparatus of claim 15, wherein the single-ended-to-differential converter comprises an inverting amplifier configured to receive the first voltage signal for a negative voltage signal of the differential voltage signal.

19. The optical sensing apparatus of claim 18, wherein the level shifter is coupled to an output of the inverting amplifier and provides the voltage level shift to generate the negative voltage signal of the differential voltage signal.

20. The optical sensing apparatus of claim 15, wherein the first power source is coupled to the transimpedance amplifier.

* * * * *